(12) United States Patent  (10) Patent No.: US 12,364,153 B2
Mizusaki et al.  (45) Date of Patent: *Jul. 15, 2025

(54) DISPLAY DEVICE

(71) Applicant: SHARP KABUSHIKI KAISHA, Osaka (JP)

(72) Inventors: Masanobu Mizusaki, Osaka (JP); Masakazu Shibasaki, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 23 days.

This patent is subject to a terminal disclaimer.

(21) Appl. No.: 18/371,107

(22) Filed: Sep. 21, 2023

(65) Prior Publication Data
US 2024/0015996 A1 Jan. 11, 2024

Related U.S. Application Data

(63) Continuation of application No. 17/856,933, filed on Jul. 1, 2022, now Pat. No. 11,805,672, which is a (Continued)

(51) Int. Cl.
H10K 50/844 (2023.01)
H10K 50/87 (2023.01)
H10K 59/80 (2023.01)
H10K 71/80 (2023.01)
H10K 77/10 (2023.01)
(Continued)

(52) U.S. Cl.
CPC ........... *H10K 71/80* (2023.02); *H10K 50/844* (2023.02); *H10K 50/87* (2023.02); *H10K 59/873* (2023.02); *H10K 59/8794* (2023.02); *H10K 77/111* (2023.02); *H10K 85/141* (2023.02); *H10K 59/12* (2023.02)

(58) Field of Classification Search
CPC .... H10K 50/844; H10K 77/111; H10K 50/87; H10K 85/141
See application file for complete search history.

(56) References Cited

U.S. PATENT DOCUMENTS

2016/0264745 A1* 9/2016 Du ............................ C08K 3/34
2017/0055365 A1* 2/2017 Sanders ................ H01L 23/373
(Continued)

*Primary Examiner* — Joshua Benitez Rosario
*Assistant Examiner* — Christopher A Culbert
(74) *Attorney, Agent, or Firm* — ScienBiziP, P.C.

(57) ABSTRACT

Provided is a display device that can retard the degradation of light-emitting elements even when the display device is used in a high temperature environment. A display device includes a TFT layer, a light-emitting element layer provided with a plurality of light-emitting elements, a heat dissipating layer, an extraction member, and a thermal insulation layer that insulates the light-emitting elements from external heat. The thermal insulation layer is made from a material containing a first resin in which a metal complex compound having an ammonium salt as a ligand is dispersed. The TFT layer is formed between the heat dissipating layer and the light-emitting element layer. The heat dissipating layer overlaps the light-emitting elements. The thermal insulation layer surrounds the heat dissipating layer. The extraction member is formed to overlap the thermal insulation layer. The heat dissipating layer and the thermal insulation layer are in direct contact with the TFT layer.

19 Claims, 5 Drawing Sheets

Related U.S. Application Data continuation of application No. 17/043,579, filed as application No. PCT/JP2018/013944 on Mar. 30, 2018, now abandoned.

(51) Int. Cl.
  *H10K 85/10* (2023.01)
  *H10K 59/12* (2023.01)

(56) References Cited

U.S. PATENT DOCUMENTS

2018/0112115 A1* 4/2018 Hamada .................. C08K 3/28
2019/0123289 A1* 4/2019 Yu .......................... H10K 71/80
2021/0005636 A1* 1/2021 Ashibe .................... C09D 5/18

* cited by examiner

DISPLAY DEVICE

CROSS-REFERENCE TO RELATED APPLICATION(S)

This application is a continuation of U.S. patent application Ser. No. 17/856,933, filed on Jul. 1, 2022, which is a continuation of U.S. patent application Ser. No. 17/043,579, filed on Sep. 29, 2020, which is the National Stage of International Application No. PCT/JP2018/013944, filed on Mar. 30, 2018, the contents of which are entirely incorporated herein by reference.

TECHNICAL FIELD

The disclosure relates to a display device provided with a thermal insulation layer.

BACKGROUND ART

Light-emitting elements used in various display devices have low heat resistance, and the light emission luminance thereof is easily reduced in a high temperature environment.

Therefore, as described in PTL1 for example, providing a heat dissipating layer on a surface of a support substrate of a display device has been proposed for known display devices.

CITATION LIST

Patent Literature

PTL1: JP 2010-147179 A (published on Jul. 1, 2010)

SUMMARY

Technical Problem

However, a problem that occurs when a known display device like that described above is used in a high temperature environment such as, for example, in an in-vehicle application, is that the heat dissipating layer does not function properly, and thus it is difficult to prevent deterioration of the light-emitting element due to heat generated by the light-emitting element.

In light of the foregoing problem, an object of the disclosure is to provide a display device that can retard the degradation of a light-emitting element even when used in a high temperature environment.

Solution to Problem

A display device according to an aspect of the disclosure is provided with: a light-emitting element layer provided with a plurality of light-emitting elements; and a TFT layer provided below the light-emitting element layer and including a TFT configured to drive each of the light-emitting elements; wherein at least one thermal insulation layer that thermally insulates the light-emitting elements from external heat is provided; and the thermal insulation layer is made from a material containing a first resin in which a metal complex compound having an ammonium salt as a ligand is dispersed.

Advantageous Effects of Disclosure

According to one aspect of the disclosure, a display device can be provided which can retard the degradation of light-emitting elements even when the display device is used in a high temperature environment.

DESCRIPTION OF EMBODIMENTS

[General Description of Manufacturing Method and Configuration of Display Device]

A method of manufacturing a display device according to an embodiment of the disclosure will be described in detail below with reference to FIG. 1 and FIG. 2. Note that hereinafter, "the same layer" means that the layer is in the same process (film formation step), "a lower layer" means that the layer is formed in an earlier process than the process in which the layer to be compared is formed, and "an upper layer" means that the layer is formed in a later process than the process in which the layer to be compared is formed.

Figure 1:
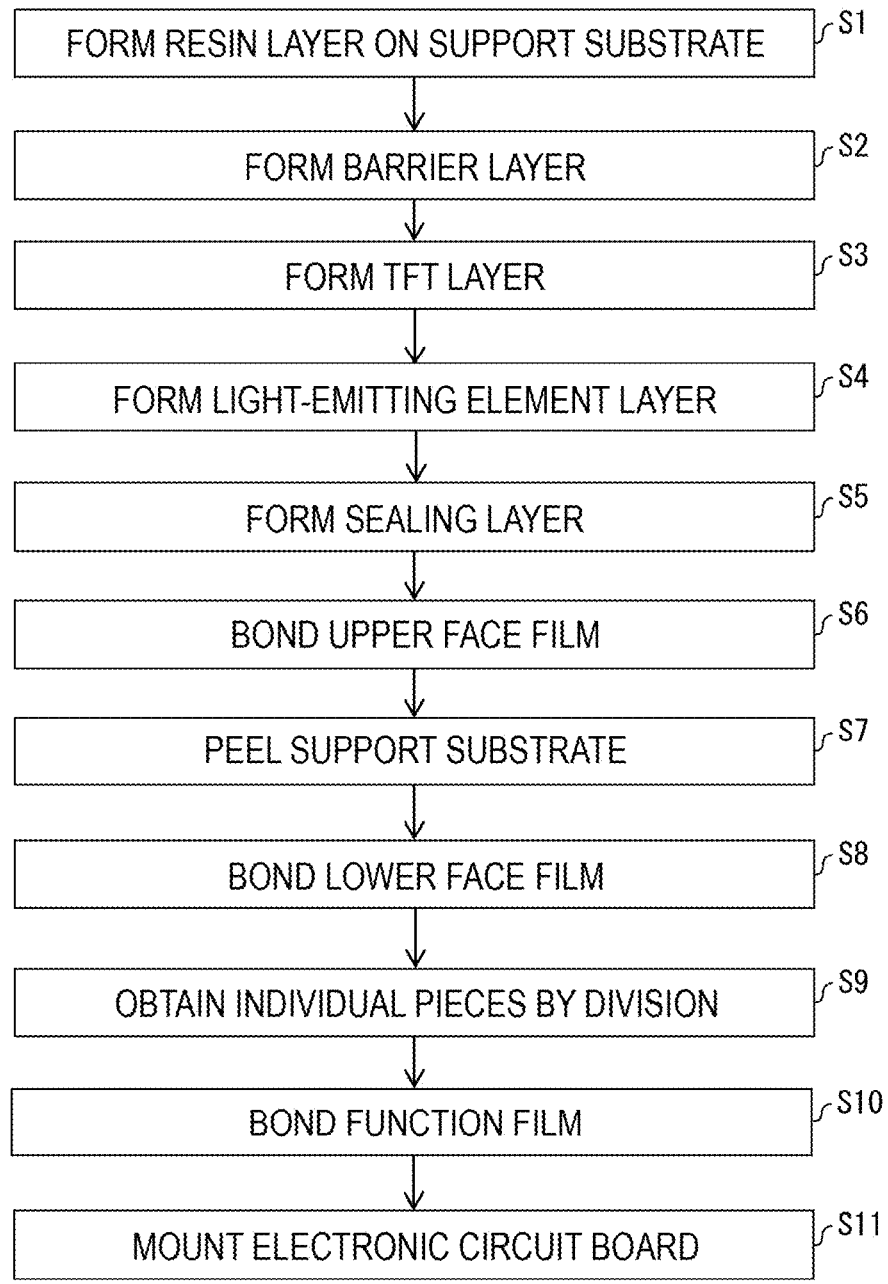
FIG. 1 is a flowchart illustrating an example of a method of manufacturing a display device.

FIG. 1 is a flowchart illustrating an example of a method of manufacturing a display device. FIG. 2 is a cross-sectional view illustrating a configuration of a display region of a display device.

Figure 2:
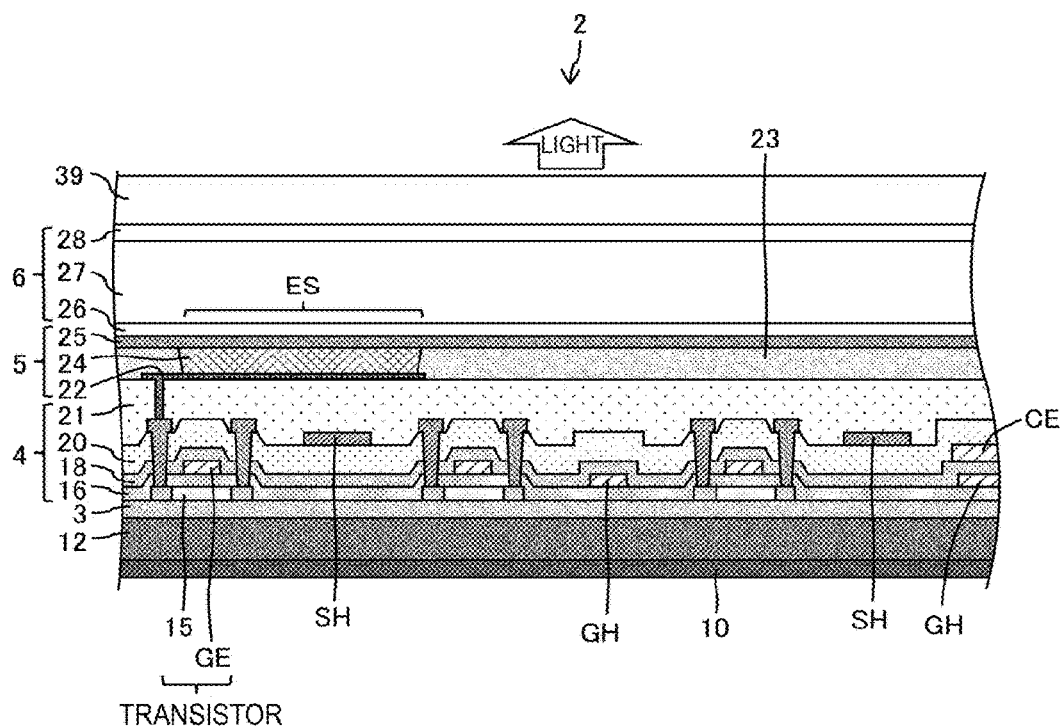
FIG. 2 is a cross-sectional view illustrating a configuration of a display region of a display device.

In a case where a flexible display device is manufactured, as illustrated in FIG. 1 and FIG. 2, first, a resin layer 12 is formed on a light-transmissive support substrate (a mother glass, for example) (step S1). Next, a barrier layer 3 is formed (step S2). Next, a TFT layer 4 is formed (step S3). Next, a top-emitting type light-emitting element layer 5 is formed (step S4). Next, a sealing film 6 is formed (step S5). Next, an upper face film 39 is bonded to the sealing film 6 (step S6).

Next, the support substrate is peeled from the resin layer 12 through irradiation with laser light, etc. (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing film 6 is divided and a plurality of individual pieces are obtained (step S9). Next, a function film is bonded on the obtained individual pieces (step S10). Next, an electronic circuit board (for example, an IC chip and a FPC) is mounted on a portion (terminal section) further to the outer side (non-display region, frame) than the display region in which a plurality of subpixels are formed (step S11). Note that steps S1 to S11 are performed by display device manufacturing apparatuses (including a film formation apparatus that performs each of steps S1 to S5).

Examples of the material of the resin layer 12 include a polyimide (PI). A portion of the resin layer 12 can be replaced by a bilayer resin film (for example, a polyimide film) and an inorganic insulating film sandwiched therebetween.

The barrier layer 3 is a layer that prevents foreign matter, such as water and oxygen, from penetrating into the TFT layer 4 and the light-emitting element layer 5, and for example, can be constituted by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (gate insulating film) as an upper layer overlaying the semiconductor film 15, a gate electrode GE and a gate wiring line GH above the inorganic insulating film 16, an inorganic insulating film 18 as an upper layer overlaying the gate electrode GE and the gate wiring line GH, a capacitance electrode CE as an upper layer overlaying the inorganic insulating film 18, an inorganic insulating film 20 as an upper layer overlaying the capacitance electrode CE, a source wiring line SH as an upper layer overlaying the inorganic insulating film 20, and a flattening film 21 (interlayer insulating film) as an upper layer overlaying the source wiring line SH.

The semiconductor film 15 is formed of, for example, a low-temperature polysilicon (LTPS) or an oxide semiconductor (for example, an In—Ga—Zn—O-based semiconductor), and a transistor (TFT) is configured to include the semiconductor film 15 and the gate electrode GE. In FIG. 2, the transistor is illustrated with a top gate structure, but may have a bottom gate structure.

The gate electrode GE, the gate wiring line GH, the capacitance electrode CE, and the source wiring line SH are each configured of a single layer film or a layered film of a metal including at least one of aluminum, tungsten, molybdenum, tantalum, chromium, titanium, and copper, for example. The TFT layer 4 in FIG. 2 includes a single-layer semiconductor layer and a trilayer metal layer.

Each of the inorganic insulating films 16, 18, and 20 can be formed of, for example, a silicon oxide (SiOx) film or a silicon nitride (SiNx) film, or a layered film of these, formed using CVD. The flattening film 21 can be formed of, for example, a coatable organic material such as a polyimide or an acryl.

The light-emitting element layer 5 includes an anode 22 above the flattening film 21, an insulating anode cover film 23 configured to cover an edge of the anode 22, an electroluminescence (EL) layer 24 as an upper layer overlaying the anode cover film 23, and a cathode 25 as an upper layer overlaying the EL layer 24. The anode cover film 23 is formed, for example, by applying an organic material such as a polyimide or an acryl and then patterning the organic material through photolithography.

For each subpixel, a light-emitting element ES (for example, an organic light-emitting diode: OLED, or a quantum dot diode: QLED) including an island-shaped anode 22, an EL layer 24, and a cathode 25 is formed in the light-emitting element layer 5, and subpixel circuits configured to control the light-emitting elements ES are formed in the TFT layer 4.

For example, the EL layer 24 is formed by layering a hole injection layer, a hole transport layer, a light-emitting layer, an electron transport layer, and an electron injection layer in this order, from the lower layer side. The light-emitting layer is formed into an island shape in an opening (for each subpixel) of the anode cover film 23 through vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

When the light-emitting layer of the OLED is formed by vapor deposition, a fine metal mask (FMM) is used. The FMM is a sheet (made of an invar material, for example) having a large number of openings, and an island shaped light-emitting layer (corresponding to one subpixel) is formed by an organic material passing through one opening.

The light-emitting layer of the QLED can, for example, form an island shaped light-emitting layer (corresponding to one subpixel) by applying, through ink-jet coating, a solvent having quantum dots diffused therein.

The anode (anode electrode) 22 is formed, for example, by layering indium tin oxide (ITO) and silver (Ag) or an alloy containing Ag, and has light reflectivity. The cathode (cathode electrode) 25 can be constituted by a light-transmissive conductive material such as a MgAg alloy (extremely thin film), ITO, or indium zinc oxide (IZO).

When the light-emitting elements ES are OLEDs, positive holes and electrons recombine inside the light-emitting layer in response to a drive current between the anode 22 and the cathode 25, and light is emitted in the process of excitons, which are generated by the recombination, transitioning to a ground state. Since the cathode 25 is light-transmissive and the anode 22 exhibits light reflectivity, the light emitted from the EL layer 24 travels upward and becomes top-emitting.

When the light-emitting elements ES are QLEDs, positive holes and electrons recombine inside the light-emitting layer in response to the drive current between the anode 22 and the cathode 25, and light (fluorescence) is emitted in the process of excitons, which are generated by the recombination, transitioning from a conduction band of quantum dots to a valence band.

A light-emitting element (such as an inorganic light-emitting diode) besides the OLED or QLED may be formed on the light-emitting element layer 5.

The sealing film 6 is light-transmissive, and includes an inorganic sealing film 26 (inorganic layer) that covers the cathode 25, and an organic buffer film 27 and an inorganic sealing film 28 (inorganic layer) as upper layers overlaying the inorganic sealing film 26. The sealing film 6 covering the light-emitting element layer 5 prevents foreign matter, such as water and oxygen, from penetrating into the light-emitting element layer 5.

The inorganic sealing film 26 and the inorganic sealing film 28 are each an inorganic insulating film, and can be formed through CVD from, for example, a silicon oxide film, a silicon nitride film, or a silicon oxynitride film, or a layered film of these. The organic buffer film 27 is a light-transmissive organic film having a flattening effect and can be formed of a coatable organic material such as an acryl. The organic buffer film 27 can be formed, for example, by ink-jet coating, but a bank configured to stop droplets may be provided in a non-display region.

The lower face film 10 is, for example, a PET film which, after the support substrate has been peeled off, is bonded on the lower face of the resin layer 12 through an adhesive layer 51 (FIG. 3 described below) to thereby achieve a display device with excellent flexibility. The function film has, for example, at least one of an optical compensation function, a touch sensor function, and a protection function.

A flexible display device was described above, but when a non-flexible display device is to be manufactured, ordinarily, the formation of a resin layer, and the replacement of the base material, etc. are not required, and therefore, for example, the processes of layering on a glass substrate of steps S2 to step S5 are implemented, after which the manufacturing process moves to step S9.

Hereinafter, in each embodiment, an example of the structure of the display device 2 will be described. However, in each embodiment, points that are similar to those described in a previously described embodiment will be omitted in the embodiments described later.

First Embodiment

Figure 3:
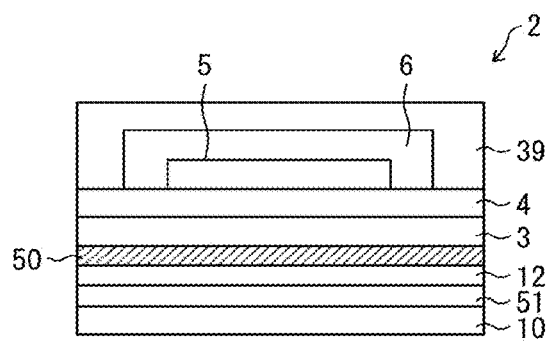
FIG. 3 is cross-sectional view illustrating a general configuration of a display device according to a first embodiment.

FIG. 3 is cross-sectional view illustrating a general configuration of a display device according to the present embodiment.

A display device 2 according to the present embodiment is provided with a thermal insulation layer 50 configured to insulate a light-emitting element layer 5 from external heat, the thermal insulation layer 50 being provided between a barrier layer 3 and a resin layer 12 in the display device 2 illustrated in FIG. 2. The thermal insulation layer 50 includes a resin (matrix resin) as a matrix material, and a metal complex compound that has an ammonium salt as a ligand and is dispersed in the resin.

The thermal insulation layer 50 is formed from a resin (first resin, hereinafter referred to as a "resin A") in which a metal complex compound having an ammonium salt as a ligand is dispersed. Here, from the perspective of increasing the heat insulating property of the thermal insulation layer 50, the metal atoms in the metal complex compound are preferably atoms of a refractory metal, and are more preferably atoms of at least one metal selected from the group consisting of molybdenum (Mo), tungsten (W), tantalum (Ta), chromium (Cr), niobium (Nb), and vanadium (V).

Metal complex compounds represented by the following general formula (1):

$$(NH_4)_m[XS_n] \quad (1)$$

are included as examples of the metal complex compound.

In general formula (1) above, m is an integer from 1 to 3, n is an integer from 1 to 4, and X denotes a metal atom (preferably, for example, an atom of at least one metal selected from the group consisting of Mo, W, Ta, Cr, Nb, and V).

More specific examples of the metal complex compound represented by general formula (1) include $(NH_4)_2[MoS_4]$, $(NH_4)_2[WS_4]$, $(NH_4)_2[TaS_4]$, $(NH_4)_2[NbS_4]$, $(NH_4)_3[VS_4]$, and $(NH_4)_2[WS_4]$.

The mixing ratio (hereinafter, referred to as the addition amount) of the metal complex compound to the resin A used in the thermal insulation layer 50 is preferably from 1 mol % to 30 mol %, and more preferably from 1.5 mol % to 10 mol %.

If the addition amount of the metal complex compound is too low, the heat insulating effect of the thermal insulation layer 50 is less likely to be obtained. On the other hand, if the addition amount of the metal complex compound is too high, when the thermal insulation layer 50 is formed by a solution coating method such as spin coating or ink-jet coating, the thickness of the thermal insulation layer 50 will not be stable, and stable film formation cannot be performed when the barrier layer 3 and the TFT layer 4 are formed on the thermal insulation layer 50. However, when the metal complex compound and the resin A are mixed in the aforementioned range, a sufficient heat insulating effect can be obtained, the thickness of the obtained thermal insulation layer 50 can be stabilized, and the layers layered on the thermal insulation layer 50 can be stably formed.

The resin A is not particularly limited as long as it is a resin having transparency, and examples thereof include at least one type of resin selected from the group consisting of polyimides, polyamides, polyesters, and acrylic resins. As described above, the resin layer 12 is formed of a resin (second resin), for example, such as a polyimide (PI) or a polyamide. The same resin may be used for the resin A and the resin used in the resin layer 12. When the same resin as the resin layer 12 (for example, a polyimide or a polyamide) is used for the resin A, compatibility (wettability) with respect to the resin layer 12 provided below the thermal insulation layer 50 is good, and adhesion is improved, but an acrylic resin can also be used as the resin A.

Examples of the polyimide include compounds having a repeating unit expressed by the following general formula (2).

[Chemical Formula 1]

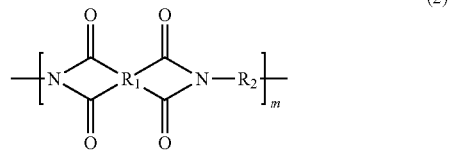

(2)

Note that in general formula (2), $R_1$ denotes any group represented by the following structural formula:

[Chemical Formula 2]

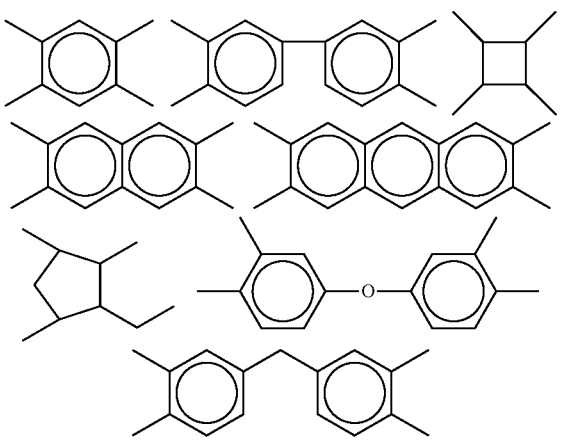

and $R_2$ denotes any group represented by the following structural formula.

[Chemical Formula 3]

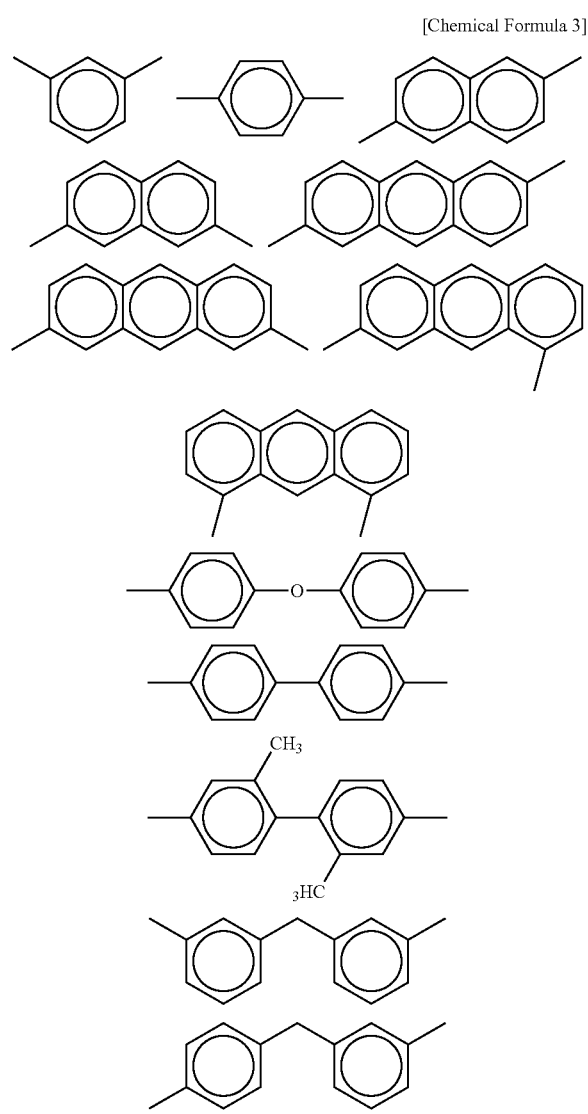

Examples of the polyamide include compounds having a repeating unit expressed by the following general formula (3).

[Chemical Formula 4]

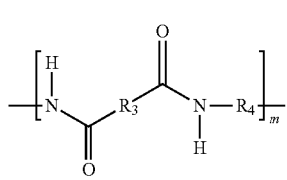

(3)

Note that in general formula (3), $R_3$ denotes any group represented by the following structural formula:

[Chemical Formula 5]

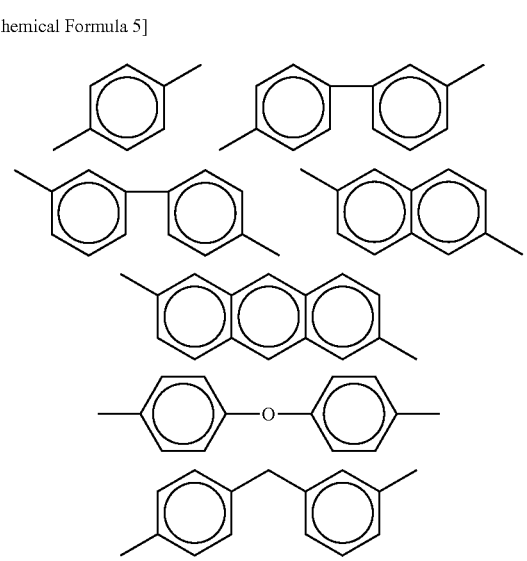

and $R_4$ denotes any group represented by the following structural formula.

[Chemical Formula 6]

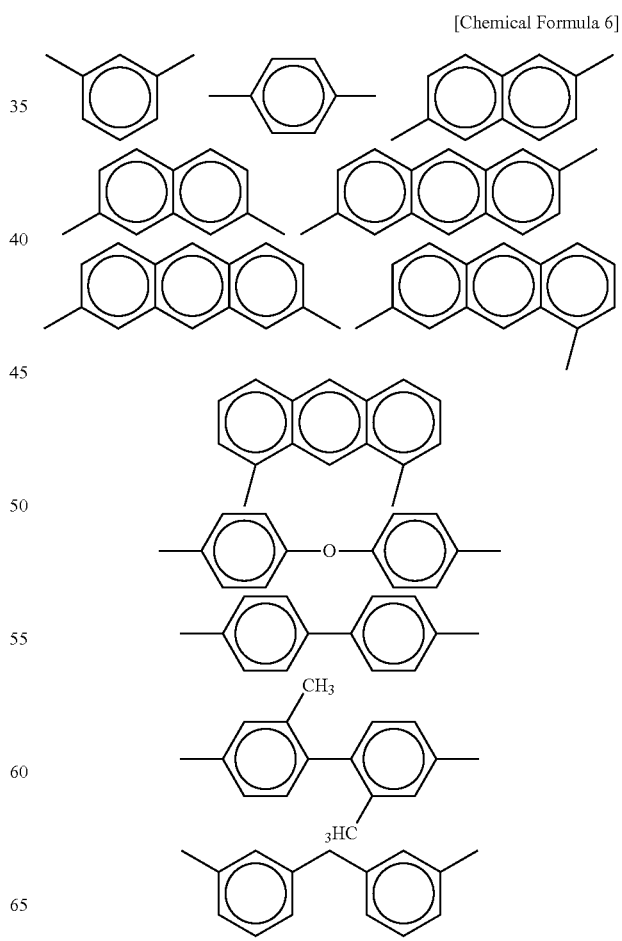

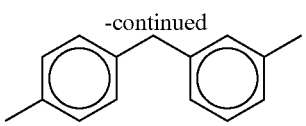

An example of a method of manufacturing the display device 2 according to the present embodiment is described briefly below. First, $(NH_4)_2[MoS_4]$ was added to a butyl cellosolve solution so as to be 3 mol %, the butyl cellosolve solution containing, at a ratio of 6 wt. %, a polyimide expressed by the following structural formula.

[Chemical Formula 7]

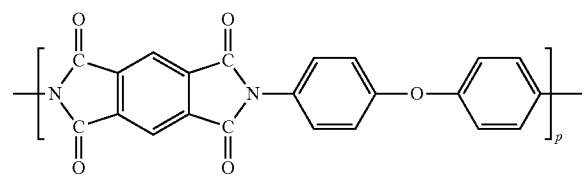

where, p represents the number of repeating units and is an integer from 5 to 500. Subsequently, the above-mentioned butyl cellosolve solution containing a polyimide and $(NH_4)_2[MoS_4]$ was thoroughly stirred to disperse $(NH_4)_2[MoS_4]$ in the polyimide, after which the resulting dispersion was stored in a refrigerator for 24 hours in a dark place. Next, the dispersion containing the polyimide and $(NH_4)_2[MoS_4]$ was applied by spin coating onto a glass substrate (support substrate) provided with a film made of PI as the resin layer 12 prepared in step S1. The substrate thus obtained was first temporarily dried for 5 minutes at 90° C. Next, the substrate was subjected to main baking for 40 minutes in an oven at 180° C., and thereby a polyimide resin film having a thickness of 500 nm and made from a polyimide resin in which $(NH_4)_2[MoS_4]$ was dispersed was formed as the thermal insulation layer 50 on the substrate. Note that an ink-jet method may be used instead of the spin coating method.

The display device 2 is manufactured by forming, in steps S2 to S6, the barrier layer 3, the TFT layer 4, the light-emitting element layer 5, and the sealing film 6 on the polyimide resin film by a predetermined method, and then performing steps S7 to S11.

As described above, by forming the thermal insulation layer 50 using the resin A in which the metal complex compound is dispersed, the dispersibility of the metal complex compound in the resin A is improved due to the polar interaction between the ammonium salt and the unpaired electrons of the amide groups contained in the resin A, and as a result, the metal complex compound can be uniformly dispersed in the resin A. Accordingly, compared to a thermal insulation layer in which the refractory metal is added alone to the resin layer 12, the heat resistance of the thermal insulation layer 50 is improved, and the thermal insulation layer 50 functions appropriately, and as a result, degradation of the light-emitting elements ES caused by heat generated by the light-emitting elements ES or the like can be prevented.

The above-described method for forming the thermal insulation layer 50 was explained using $(NH_4)_2[MoS_4]$ as the metal complex compound and a polyimide as the resin A, but the combination of the metal complex compound and the resin A used when forming the thermal insulation layer 50 is not limited thereto. For example, the thermal insulation layer 50 may be formed using $(NH_4)_2[WS_4]$ as the metal complex compound and a polyamide as the resin A.

In addition, the thermal insulation layer 50 can be formed by the same process as described above also when a polyamide or an acrylic resin is used as the resin A.

The main baking temperature is not particularly limited as long as it is a temperature at which the solvent evaporates, and is preferably from 140° C. to 220° C. When the main baking temperature is lower than 140° C., depending on the type of solvent, the solvent may not be completely removed. When the solvent remains, the solvent behaves as an impurity, and there is a risk of causing characteristic degradation of the light-emitting elements ES. On the other hand, when the main baking temperature is higher than 220° C., the temperature of the oven is generally less stable, and as a result, it becomes difficult to form a homogeneous film (thermal insulation layer 50).

The thickness of the thermal insulation layer 50 is not particularly limited, and is preferably from 20 nm to 1000 nm in order to configure such that the heat insulating effect is not excessively reduced due to a decrease in the film thickness, and such that the light intensity is not decreased due to an increase in the film thickness. Moreover, from the perspectives of ensuring the heat insulating effect and suppressing a decrease in light intensity, the thickness of the thermal insulation layer 50 is more preferably from 100 nm to 300 nm.

Example 1

The decrease in the luminance characteristics of the light-emitting elements ES of the display device 2 having the structure illustrated in FIG. 3 and manufactured according to the method described above, was tracked by an operating test at 70° C. As a result, the time for the luminance to decrease to 90% relative to the initial luminance was 110 hours.

Comparative Example 1

A display device 2 having the structure illustrated in FIG. 3 was manufactured by the same method as in Example 1 with the exception that Mo was used instead of $(NH_4)_2[MoS_4]$ in Example 1. The decrease in the luminance characteristics of the light-emitting elements ES of the display device 2 was tracked by an operating test at 70° C. As a result, the time for the luminance to decrease to 90% relative to the initial luminance was 85 hours.

From the results of Example 1 and Comparative Example 1, it can be seen that degradation of the light-emitting elements ES is reduced by the thermal insulation layer 50 of Example 1. In addition, according to the present embodiment, the thermal insulation layer 50 can provide insulation against external heat entering the display device 2 from a lower layer side of the barrier layer 3, that is, from the substrate side. As described above, according to the present embodiment, a display device 2 capable of retarding the degradation of the light-emitting elements ES by insulating the light-emitting elements ES from external heat (suppressing heat conduction) can be provided.

Modified Example

Figure 4:
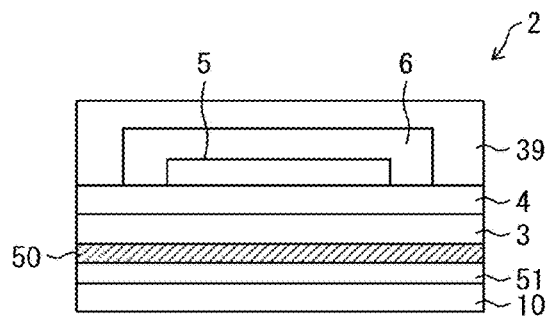
FIG. 4 is a cross-sectional view illustrating another general configuration of a display device according to the first embodiment.

FIG. 4 is a cross-sectional view illustrating another general configuration of a display device 2 according to the present embodiment.

As described above, the matrix resin of the thermal insulation layer 50 may be the same resin as that of the resin layer 12. Therefore, as illustrated in FIG. 4, rather than separately providing the resin layer 12 and the thermal insulation layer 50, the thermal insulation layer 50 may be provided instead of the resin layer 12. In other words, the resin layer 12 may include the metal complex compound, and a flexible substrate itself may be the thermal insulation layer 50. The flexible substrate may serve as both the substrate and the thermal insulation layer 50, and thereby an increase in the number of components of the display device 2 due to the formation of the thermal insulation layer 50 can be suppressed.

In a case where the display device 2 is not a flexible substrate, the thermal insulation layer 50 may be formed between the substrate such as a glass substrate and the TFT layer 4, for example.

According to the present embodiment, in any case, insulation against external heat entering the display device 2 from the substrate side can be provided. In addition, according to the present embodiment, the position of the thermal insulation layer 50 is on the side opposite the direction of light extraction, and therefore the film thickness and the metal complex content can be increased, and the heat insulating effect can be enhanced.

Second Embodiment

Figure 5:
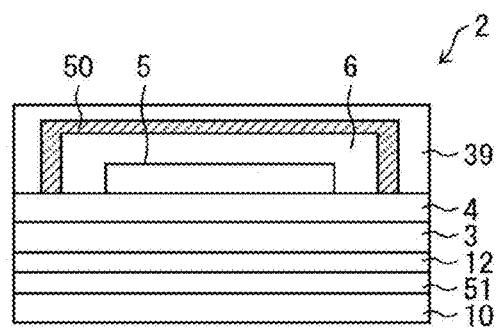
FIG. 5 is a cross-sectional view illustrating a general configuration of a display device according to a second embodiment.

FIG. 5 is a cross-sectional view illustrating a general configuration of the display device 2 according to a second embodiment.

As illustrated in FIG. 5, in the display device 2 according to the present embodiment, a thermal insulation layer 50 is formed on the sealing film 6 to cover the light-emitting element layer 5.

Note that the material and formation method of the thermal insulation layer 50 are the same as those of the first embodiment, and thus descriptions thereof will be omitted here. In the present embodiment as well, the addition amount of the metal complex compound in the resin A used in the thermal insulation layer 50 is preferably set in the same manner as in the first embodiment for the same reasons as in the first embodiment. The thickness of the thermal insulation layer 50 is also preferably set in the same manner as in the first embodiment for the same reasons as in the first embodiment.

In the display device 2 according to the present embodiment, the thermal insulation layer 50 is formed to surround the light-emitting element layer 5, and therefore a temperature stabilizing effect within the light-emitting element layer 5 increases. Thus, compared to the display devices 2 illustrated in FIG. 3 and FIG. 4, a heat insulating effect is easily obtained even if the thermal insulation layer 50 has a thin thickness or the addition amount of the metal complex compound is low.

Example 2

A display device 2 having the structure illustrated in FIG. 5 and provided with a thermal insulation layer 50 having a thickness of 100 nm was manufactured using a dispersion obtained by the same method as in Example 1 with the exception that $(NH_4)_2[WS_4]$ was added to a butyl cellosolve solution so as to be 3 mol %, the butyl cellosolve solution containing, in place of the polyimide in Example 1, a polyamide expressed by the following structural formula at a ratio of 6 wt. %.

[Chemical Formula 8]

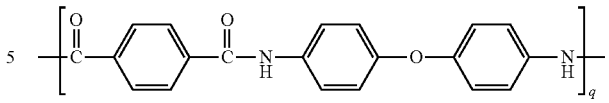

where, q represents the number of repeating units and is an integer from 5 to 500. The decrease in the luminance characteristics of the light-emitting elements ES of the display device 2 was tracked by an operating test at 70° C. As a result, the time for the luminance to decrease to 90% relative to the initial luminance was 120 h.

Comparative Example 2

A display device 2 having the structure illustrated in FIG. 5 was manufactured by the same method as in Example 2 with the exception that W was used instead of $(NH_4)_2[WS_4]$ of Example 2. The decrease in the luminance characteristics of the light-emitting elements ES of the display device 2 was tracked by an operating test at 70° C. As a result, the time for the luminance to decrease to 90% relative to the initial luminance was 83 hours.

From the results of Example 2 and Comparative Example 2, it can be seen that degradation of the light-emitting elements ES is reduced by the thermal insulation layer 50 of Example 2. In addition, according to the present embodiment, insulation against external heat entering the display device 2 from the upper side of the light-emitting elements ES can be provided. As described above, even with the present embodiment, a display device 2 capable of retarding the degradation of the light-emitting elements ES by insulating the light-emitting elements ES from external heat (suppressing heat conduction) can be provided.

Third Embodiment

Figure 6:
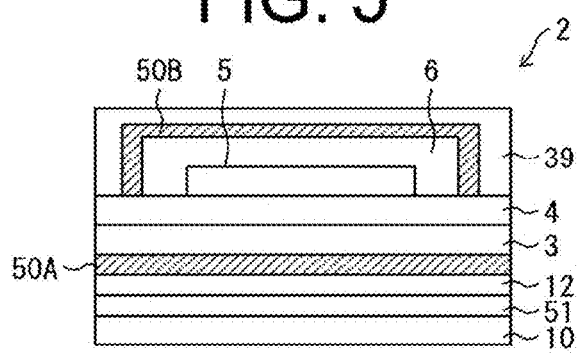
FIG. 6 is a cross-sectional view illustrating a general configuration of a display device according to a third embodiment.

FIG. 6 is a cross-sectional view illustrating a general configuration of the display device 2 according to a third embodiment.

As illustrated in FIG. 6, in the display device 2 according to the present embodiment, as thermal insulation layers, a thermal insulation layer 50A is formed between the resin layer 12 and the barrier layer 3, and a thermal insulation layer 50B is formed between the sealing film 6 and an upper face film 39. Note that the thermal insulation layer 50A is the same as the thermal insulation layer 50 according to the first embodiment, and the thermal insulation layer 50B is the same as the thermal insulation layer 50 according to the second embodiment. Accordingly, a description thereof is omitted. As described above, the display device 2 may include a plurality of thermal insulation layers. When a plurality of thermal insulation layers 50 are provided, the thicknesses of the thermal insulation layer 50A and the thermal insulation layer 50B may be the same or different.

In the display device 2 according to the present embodiment, the light-emitting element layer 5 is completely surrounded by providing the thermal insulation layer 50A and the thermal insulation layer 50B, and therefore the heat insulating effect is maximized.

Fourth Embodiment

Figure 7:
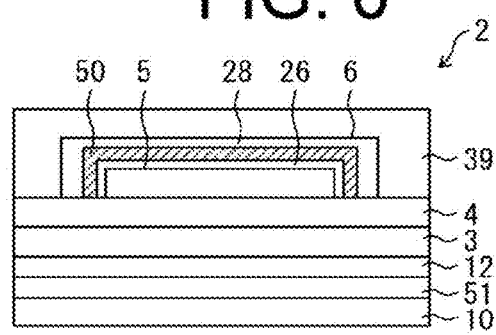
FIG. 7 is a cross-sectional view illustrating a general configuration of a display device according to a fourth embodiment.

FIG. 7 is a cross-sectional view illustrating a general configuration of the display device 2 according to a fourth embodiment.

As illustrated in FIG. 7, the thermal insulation layer 50 of the display device 2 according to the present embodiment is an organic buffer film 27 included in the sealing film 6 covering the light-emitting element layer 5. In other words, the organic buffer film 27 functions as the thermal insulation layer 50. According to the present embodiment, insulation against external heat entering the light-emitting elements ES can be provided through the sealing film 6.

Note that the material, formation method, and thickness of the thermal insulation layer 50 are the same as those of the first to third embodiments, and thus descriptions thereof will be omitted here. On the other hand, although the addition amount of the metal complex compound is the same as that within the range described in the first to third embodiments (from 1 to 30 mol %), from the perspective of adhesion with the light-emitting element layer 5 constituted by an organic compound, for example, the addition amount of the metal complex compound is preferably less than the addition amounts described above in the first to third embodiments. This is because the metal complex compound described above has relatively low adhesion to the material forming the light-emitting element layer 5. Therefore, the addition amount of the metal complex compound in the present embodiment is preferably from 1 to 2 mol %.

Fifth Embodiment

Figure 8:
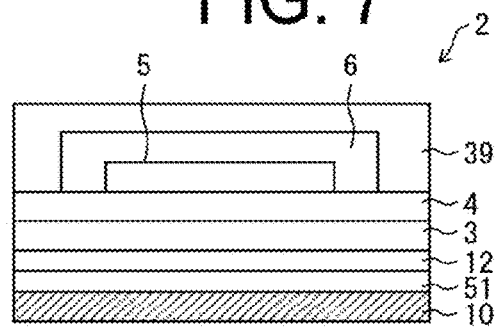
FIG. 8 is a cross-sectional view illustrating a general configuration of a display device according to a fifth embodiment.

FIG. 8 is a cross-sectional view illustrating a general configuration of the display device 2 according to a fifth embodiment.

The display device 2 in the present embodiment includes a substrate (resin layer 12), and may be configured such that the thermal insulation layer 50 is formed on a side of the substrate that is opposite the surface on which the TFT layer 4 is formed, and such that a lower face film 10 is the thermal insulation layer 50. In other words, the lower face film 10 may also serve as the thermal insulation layer 50. According to the present embodiment, insulation against external heat entering the display device 2 from the substrate side can be provided by the lower face film 10, and an increase in the number of components of the display device 2 due to the formation of the thermal insulation layer 50 can be suppressed.

Note that the material, formation method, and thickness of the thermal insulation layer 50 are the same as those of the first to fourth embodiments, and thus descriptions thereof will be omitted here.

On the other hand, although the addition amount of the metal complex compound is within the aforementioned range (from 1 to 30 mol %), it is preferable to add a larger amount of the metal complex compound. The thermal insulation layer 50 according to the present embodiment is provided at an opposite side of the light extraction direction and at a position where only one surface is in contact with the substrate (resin layer 12), and therefore the addition amount of the metal complex compound is preferably from 25 to 30 mol %. Also, regarding the thickness of the thermal insulation layer 50, because the thermal insulation layer 50 is provided at the opposite side of the light extraction direction, the thickness of the thermal insulation layer 50 can be increased. The preferred thickness of the thermal insulation layer 50 is from 500 nm to 1000 nm. When the thickness thereof exceeds 1000 nm, the feature of being a thin display may be lost.

The thermal insulation layer 50 provided on the display device 2 according to the present embodiment has little impact on the heat insulating effect imparted to the light-emitting element layer 5 when compared to the first to fourth embodiments. However, as described above, the thermal insulation layer 50 is provided at the opposite side of the light extraction direction and at a position where only one surface is in contact with the substrate (resin layer 12), which is relatively easy even from the perspective of the film formation process. Therefore, the film thickness can be increased and the range of amount of the metal complex compound that can be added can be expanded.

Sixth Embodiment

Figure 9A:
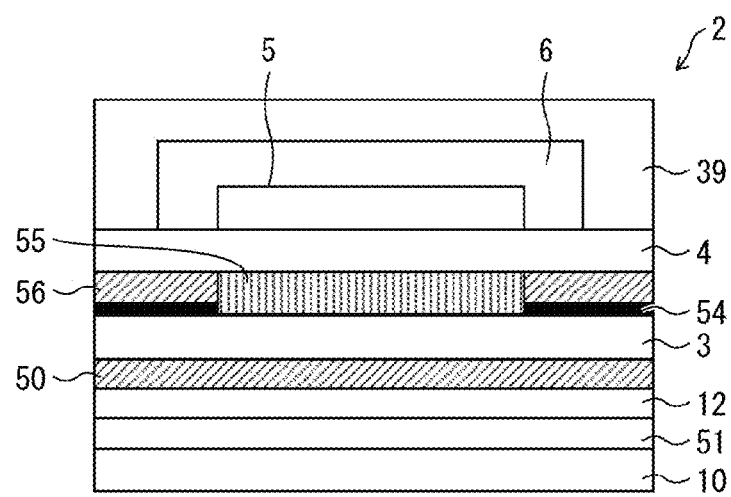
FIG. 9A is a cross-sectional view illustrating a configuration example of a display region of a display device according to a sixth embodiment.
Figure 9B:
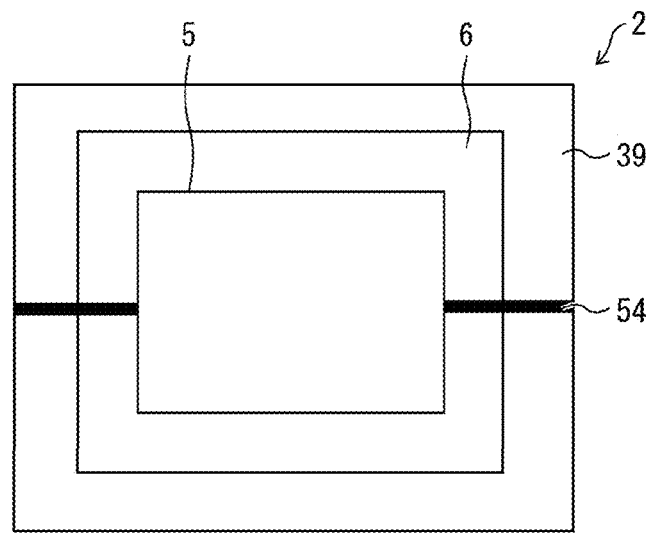
FIG. 9B is a plan view illustrating the configuration of the display device illustrated in FIG. 9A.

FIG. 9A is a cross-sectional view illustrating a configuration example of a display region of a display device 2 according to a sixth embodiment, and FIG. 9B is a plan view illustrating the configuration of the display device 2 illustrated in FIG. 9A.

As illustrated in FIG. 9A, the display device 2 according to the present embodiment has a configuration in which the display device 2 according to the first embodiment is provided with a heat dissipating layer 55 that dissipates heat from the light-emitting element layer 5 to the outside, and a thermal insulation layer 56 surrounding the heat dissipating layer 55 in a plan view. In the present embodiment, the TFT layer 4 is formed between the heat dissipating layer 55 and the light-emitting element layer 5.

The thermal insulation layer 56 is provided in the same layer as the heat dissipating layer 55. The thermal insulation layer 56 may be formed in the same manner as the thermal insulation layer 50. The same material as that of the thermal insulation layer 50 can be used for the thermal insulation layer 56. In addition, the addition amount of the metal complex compound in the resin A that is used in the thermal insulation layer 56 can be set in the same manner as that of the thermal insulation layer 50. Note that the same material may be used for the thermal insulation layer 50 and the thermal insulation layer 56, or different materials may be used.

The heat dissipating layer 55 includes a resin and inorganic nanoparticles dispersed in the resin. Examples of the resin include acrylic resins, polyimides, polyesters, and polyamide resins. Among these, acrylic resins are most preferable from the perspective of heat dissipation. Furthermore, when an acrylic resin is used, a film can be formed by polymerizing the monomer through photopolymerization, and thus handling is convenient also in terms of the process.

The diameter of the inorganic nanoparticles contained in the resin is preferably within a range of from 5 to 100 nm, and more preferably in a range of from 10 to 30 nm. If the diameter of the inorganic nanoparticles is smaller than 5 nm, there is a risk that a sufficient heat dissipation effect cannot be obtained. On the other hand, when the diameter of the inorganic nanoparticles is greater than 100 nm, the inorganic nanoparticles are less likely to disperse in the resin, and the inorganic nanoparticles may separate. Furthermore, when inorganic nanoparticles having a diameter smaller than 5 nm are introduced at a high concentration, aggregation of the inorganic nanoparticles may occur as a result, and the inorganic nanoparticles may separate from the resin.

Examples of the inorganic nanoparticles include at least one type selected from the group consisting of silver, copper, aluminum, magnesium, tin, silicon, and oxides thereof. The inorganic nanoparticles are easily dispersed in the acrylic resin due to the intermolecular force between the inorganic nanoparticles and the acrylic resin, and as a result, the inorganic nanoparticles are uniformly dispersed in the acrylic resin, and a heat dissipating layer 55 that exhibits a high heat dissipation effect is obtained. Accordingly, the heat dissipating property of the heat dissipating layer 55 is improved, and the heat dissipating layer 55 functions properly, and as a result, degradation of the light-emitting elements ES caused by heat generated by the light-emitting elements ES or the like can be prevented.

The content of the inorganic nanoparticles in the heat dissipating layer 55 is preferably from 5 to 40 wt. % relative to the amount of the acrylic resin. When the size of the inorganic nanoparticles is set to the above-mentioned range, induced dipole interaction occurs between the above-described metal having a heat dissipating property and O groups (an ester group, carbonyl group, or ether group) and N groups (amine) contained in the acrylic resin, and therefore a sufficient heat dissipation effect can be obtained, and the inorganic nanoparticles can be uniformly dispersed in the acrylic resin. Furthermore, on the surface of the aforementioned metal having a heat dissipating property, an oxide film may be formed, and in this case, in particular, compatibility between the O groups contained in the acrylic resin and the metal is particularly improved.

The thickness of the heat dissipating layer 55 is not particularly limited, but is preferably from 20 nm to 1000 nm, and more preferably from 100 nm to 300 nm because heat generated inside the light-emitting element layer 5 is absorbed and the heat insulating effect is not suppressed.

In addition to the configuration described above, the display device 2 according to the present embodiment is further provided with an extraction wiring line 54 (extraction member) that extracts heat from the heat dissipating layer 55 to the outside. In a plan view (see FIG. 9B), the heat dissipating layer 55 overlaps the light-emitting elements ES. In a plan view, the thermal insulation layer 50 surrounds the periphery of the heat dissipating layer 55. The extraction wiring line 54 is connected to the heat dissipating layer 55 and is formed to overlap the thermal insulation layer 50 in a plan view. By forming the heat dissipating layer 55 to overlap the thermal insulation layer 50, heat can be efficiently dissipated from the heat dissipating layer 55 towards the external environment. Wiring line material similar to wiring line such as the gate wiring line GH and the source wiring line SH can be used for the extraction wiring line 54.

A method of forming the heat dissipating layer 55 will be described with reference to FIGS. 9A and 9B and FIGS. 10A to 10D. FIGS. 10A to 10D are cross-sectional views explaining the process for manufacturing the heat dissipating layer 55 in order of the steps.

First, as illustrated in FIG. 9A, similar to the first embodiment, a thermal insulation layer 50 is formed on a resin layer 12, and a barrier layer 3 is formed on the thermal insulation layer 50. Next, as illustrated in FIGS. 9A and 9B, an extraction wiring line 54 is formed on the barrier layer 3. Meanwhile, a solution containing a monomer for an acrylic resin and an above-described metal having a heat dissipating property (including a metal oxide containing the metal) is prepared. An alcohol-based solvent or hexane are commonly used as the solvent. Here, the content of the metal (metal oxide) in the solution is from 5 to 40 wt. % and more preferably from 10 to 20 wt. % relative to the amount of the acrylic monomer.

Figure 10A:
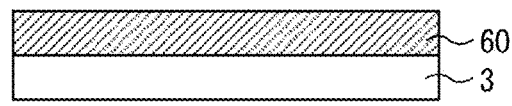
FIGS. 10A to 10D are cross-sectional views explaining a process for manufacturing the heat dissipating layer in order of the steps.
Figure 10B:
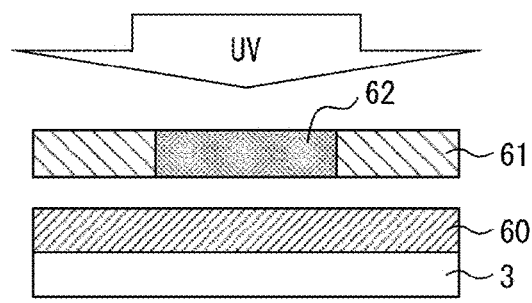
Figure 10C:
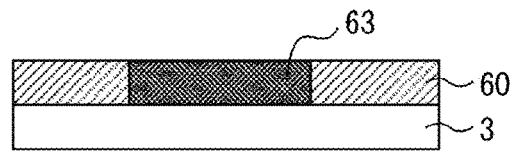
Figure 10D:
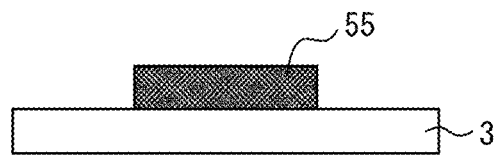

Next, the solution is applied onto the barrier layer 3 to form a metal-containing acrylic monomer layer 60 on the barrier layer 3, as illustrated in FIG. 10A. Subsequently, as illustrated in FIG. 10B, the metal-containing acrylic monomer layer 60 is irradiated with UV light through openings 62 of a mask 61. Through this, as illustrated in FIG. 10C, the metal-containing acrylic monomer of a UV light irradiated portion 63 in the metal-containing acrylic monomer layer 60 is photopolymerized, and a metal-containing acrylic resin is formed. Next, as illustrated in FIG. 10D, the unreacted metal-containing acrylic monomers (other portions than the UV light irradiated portion 63 in the metal-containing acrylic monomer layer 60) are washed off with a solvent such as an alcohol or hexane. Through this, a heat dissipating layer 55 that remains on the barrier layer 3 and is formed from the metal-containing acrylic resin of the UV light irradiated portion 63 is obtained.

Note that the method of forming the heat dissipating layer 55 is not limited to the method described above, and for example, a method of adhering a film, or a method of forming a film through coating may be used.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

Supplement

A display device according to an aspect of the disclosure is provided with: a light-emitting element layer provided with a plurality of light-emitting elements; and a TFT layer provided below the light-emitting element layer and including a TFT configured to drive each of the light-emitting elements; wherein at least one thermal insulation layer that thermally insulates the light-emitting elements from external heat is provided; and the thermal insulation layer is made from a material containing a first resin in which a metal complex compound having an ammonium salt as a ligand is dispersed.

Even when a single metal is dispersed in the resin, the metal is not uniformly dispersed, and is unevenly distributed in the resin. However, according to the above configuration, the metal complex compound can be uniformly dispersed in the first resin. Thus, according to the above configuration, the thermal insulation layer properly functions, and thereby degradation of the plurality of light-emitting elements can be retarded even with use in a high temperature environment.

In a display device according to an aspect of the disclosure, metal atoms included in the metal complex compound are preferably atoms of a refractory metal.

According to the configuration described above, the heat insulating properties of the thermal insulation layer can be increased.

In a display device according to an aspect of the disclosure, the metal atoms included in the metal complex compound are preferably atoms of at least one type of metal atom selected from the group consisting of tungsten, tantalum, chromium, niobium, and vanadium.

According to the configuration described above, the heat insulating properties of the thermal insulation layer can be increased.

In a display device according to an aspect of the disclosure, the metal complex compound is preferably represented by the following general formula (1):

$$(NH_4)_m[XS_n] \quad\quad (1)$$

where, m denotes an integer from 1 to 3, n denotes an integer from 1 to 4, and X denotes the metal atom.

According to the above configuration, dispersibility of the metal complex compound in the thermal insulation layer can be increased.

In a display device according to an aspect of the disclosure, a mixing ratio of the metal complex compound to the first resin is preferably from 1 mol % to 30 mol %.

According to the above configuration, when the metal complex compound is mixed with the first resin in the aforementioned range, a sufficient heat insulating effect can be obtained, the thickness of the obtained thermal insulation layer can be stabilized, and the layers layered on the thermal insulation layer can be stably formed.

In a display device according to an aspect of the disclosure, the first resin preferably includes at least one type of resin selected from the group consisting of polyimides, polyamides, polyesters, and acrylic resins.

According to the configuration described above, the dispersibility of the metal complex compound in the first resin is improved due to polar interaction between the ammonium salt and the unpaired electrons of the amide groups or imide groups contained in the first resin, and as a result, the metal complex compound can be uniformly dispersed in the first resin.

A display device according to an aspect of the disclosure is provided with a substrate, and includes a configuration in which the thermal insulation layer is formed between the substrate and the TFT layer.

According to the above-described configuration, insulation can be provided against external heat entering the display device from the substrate side.

In a display device according to an aspect of the disclosure, the substrate is a flexible substrate provided with a resin layer made from a second resin, and the first resin and the second resin may be the same resin.

According to the above configuration, a thermal insulation layer that uses, as the first resin, a resin that is the same as the second resin, is provided between the TFT layer and a flexible substrate provided with a resin layer made from the second resin, and thereby a thermal insulation layer having good adhesion to the resin layer can be formed.

In a display device according to an aspect of the disclosure, the thermal insulation layer may be a flexible substrate.

According to the configuration above, the flexible substrate serves as both the substrate and the thermal insulation layer, and thereby an increase in the number of components in the display device due to the formation of the thermal insulation layer can be suppressed.

A display device according to an aspect of the disclosure is provided with a substrate, and the thermal insulation layer may be formed on a side of the substrate opposite a surface on which the TFT layer is formed.

According to the above-described configuration, insulation can be provided against external heat entering the display device from the substrate side.

In a display device according to an aspect of the disclosure, the thermal insulation layer may be formed covering the plurality of light-emitting elements.

According to the configuration described above, insulation can be provided against external heat entering the plurality of light-emitting elements from above the plurality of light-emitting elements.

A display device according to an aspect of the disclosure is provided with a sealing film covering the plurality of light-emitting elements, and the thermal insulation layer may be provided on the sealing film.

According to the configuration described above, the thermal insulation layer is formed surrounding the light-emitting element layer, and therefore, a temperature stabilizing effect in the light-emitting element layer increases, making it easier to obtain a heat insulating effect even with a thin film thickness or a low addition amount of the metal complex compound.

A display device according to an aspect of the disclosure may be provided with a sealing film that includes the thermal insulation layer and an inorganic layer, and covers the light-emitting element layer.

According to the configuration described above, insulation can be provided through the sealing film against external heat entering the plurality of light-emitting elements.

A display device according to an aspect of the disclosure is provided with a heat dissipating layer configured to dissipate heat from the plurality of light-emitting elements, and the TFT layer may be formed between the heat dissipating layer and the light-emitting element layer.

According to the configuration described above, heat from the plurality of light-emitting elements can be dissipated.

In a display device according to an aspect of the disclosure, an extraction member that extracts the heat to the outside is connected to the heat dissipating layer, and in plan view, the heat dissipating layer overlaps the plurality of light-emitting elements, in a plan view, the thermal insulation layer surrounds the heat dissipating layer, and the extraction member may be formed overlapping the thermal insulation layer in a plan view.

According to the configuration described above, heat from the plurality of light-emitting elements can be efficiently dissipated to the outside via the heat dissipating layer and the extraction member.

In a display device according to an aspect of the disclosure, the heat dissipating layer is preferably made from a material including an acrylic resin in which inorganic nanoparticles are dispersed.

According to the above-described configuration, a heat dissipating layer having a higher heat dissipation effect is obtained.

In the display device according to an aspect of the disclosure, the inorganic nanoparticles are preferably at least one type selected from the group consisting of silver, copper, aluminum, magnesium, tin, silicon, and oxides thereof.

According to the above-described configuration, the inorganic nanoparticles described above are a metal having high heat dissipation, and therefore a heat dissipating layer having high heat dissipation can be obtained by using a metal described above.

In the display device according to an aspect of the disclosure, the content of the inorganic nanoparticles contained in the material of the heat dissipating layer is preferably from 5 to 40 wt. % relative to an amount of the acrylic resin.

According to the configuration described above, a sufficient heat dissipation effect can be obtained, and the inorganic nanoparticles can be uniformly dispersed in the acrylic resin.

The invention claimed is:

1. A display device comprising:
   a light-emitting element layer provided with a plurality of light-emitting elements;
   a thin-film transistor (TFT) layer provided below the light-emitting element layer and including a TFT configured to drive the plurality of light-emitting elements; and
   at least one thermal insulation layer configured to thermally insulate the plurality of light-emitting elements from external heat, wherein the at least one thermal insulation layer comprises a material containing a first resin in which a metal complex compound having an ammonium salt as a ligand is dispersed, and metal atoms included in the metal complex compound comprise atoms of a refractory metal.

2. The display device according to claim 1, wherein the metal atoms included in the metal complex compound comprise atoms of at least one type of metal selected from the group consisting of tungsten, tantalum, chromium, niobium, and vanadium.

3. The display device according to claim 1, wherein the metal complex compound is represented by a general formula (1):

$$(NH_4)_m[XS_n] \qquad (1)$$

where m denotes an integer from 1 to 3, n denotes an integer from 1 to 4, and X denotes a metal atom.

4. The display device according to claim 1, wherein a mixing ratio of the metal complex compound to the first resin is from 1 mol % to 30 mol %.

5. The display device according to claim 1, wherein the first resin includes at least one type of resin selected from the group consisting of polyimides, polyamides, polyesters, and acrylic resins.

6. The display device according to claim 1, further comprising:
a substrate,
wherein the at least one thermal insulation layer is formed between the substrate and the TFT layer.

7. The display device according to claim 6, wherein the substrate comprises a flexible substrate provided with a resin layer made from a second resin, and the first resin and the second resin are a same resin.

8. The display device according to claim 1, wherein the at least one thermal insulation layer is a flexible substrate.

9. The display device according to claim 1, further comprising:
a substrate,
wherein the at least one thermal insulation layer is formed on a side of the substrate opposite a surface on which the TFT layer is formed.

10. The display device according to claim 1, wherein the at least one thermal insulation layer is formed covering the plurality of light-emitting elements.

11. The display device according to claim 1, further comprising:
a sealing film covering the plurality of light-emitting elements,
wherein the at least one thermal insulation layer is provided on the sealing film.

12. The display device according to claim 1, further comprising:
a sealing film including the at least one thermal insulation layer and an inorganic layer, and covering the light-emitting element layer.

13. The display device according to claim 1, further comprising:
a heat dissipating layer configured to dissipate heat from the plurality of light-emitting elements,
wherein the TFT layer is formed between the heat dissipating layer and the light-emitting element layer.

14. The display device according to claim 13, further comprising:
an extraction member connected to the heat dissipating layer and configured to extract the heat toward outside, wherein
in a plan view, the heat dissipating layer overlaps the plurality of light-emitting elements,
in the plan view, the at least one thermal insulation layer surrounds the heat dissipating layer, and
the extraction member is formed overlapping the at least one thermal insulation layer in the plan view.

15. The display device according to claim 13, wherein the heat dissipating layer comprises a material including an acrylic resin in which inorganic nanoparticles are dispersed.

16. The display device according to claim 15, wherein the inorganic nanoparticles are at least one type selected from the group consisting of silver, copper, aluminum, magnesium, tin, silicon, and oxides thereof.

17. The display device according to claim 15, wherein a content of the inorganic nanoparticles contained in the material of the heat dissipating layer is from 5 to 40 wt. % relative to an amount of the acrylic resin.

18. The display device according to claim 1, further comprising:
an inorganic barrier layer made from an inorganic material; and
a resin layer,
wherein the at least one thermal insulation layer is provided between the resin layer and the inorganic barrier layer, and
the inorganic barrier layer is provided between the at least one thermal insulation layer and the TFT layer.

19. The display device according to claim 18, wherein the resin layer is made from a material different from the first resin.

* * * * *